(12) United States Patent
Kumar et al.

(10) Patent No.: US 9,142,459 B1
(45) Date of Patent: Sep. 22, 2015

(54) WAFER DICING USING HYBRID LASER SCRIBING AND PLASMA ETCH APPROACH WITH MASK APPLICATION BY VACUUM LAMINATION

(71) Applicants: Prabhat Kumar, Fremont, CA (US); Wei-Sheng Lei, San Jose, CA (US); Brad Eaton, Menlo Park, CA (US); Ajay Kumar, Cupertino, CA (US)

(72) Inventors: Prabhat Kumar, Fremont, CA (US); Wei-Sheng Lei, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/320,426

(22) Filed: Jun. 30, 2014

(51) Int. Cl.
  *H01L 21/00* (2006.01)
  *H01L 21/822* (2006.01)
  *H01L 21/033* (2006.01)
  *H01L 21/02* (2006.01)

(52) U.S. Cl.
  CPC ........ *H01L 21/822* (2013.01); *H01L 21/02019* (2013.01); *H01L 21/0335* (2013.01); *H01L 21/0337* (2013.01)

(58) Field of Classification Search
  CPC ............. H01L 21/30655; H01L 21/3086; H01L 21/67207; H01L 21/78; H01L 2924/00; H01L 2224/73265; H01L 2924/00014; H01L 2224/48227; H01L 2224/32225; H01L 2924/00012; H01L 2224/48091; H01L 21/3065; H01L 21/6836; H01L 21/67069; H01L 2221/68327; H01L 2924/15311; H01L 2924/01033; H01L 24/48; H01L 2924/01079; H01L 24/83

USPC ......... 438/113, 118, 458, 460, 462–464, 474, 438/710, 942, 975–977
  See application file for complete search history.

(56) References Cited

U.S. PATENT DOCUMENTS

| | | | |
|---|---|---|---|
| 4,049,944 A | 9/1977 | Garvin et al. | |
| 4,339,528 A | 7/1982 | Goldman | |
| 4,684,437 A | 8/1987 | Donelon et al. | |
| 4,941,255 A * | 7/1990 | Bull ............................... | 29/833 |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Michelle Mandala
(74) *Attorney, Agent, or Firm* — Blakely Sokoloff Taylor Zafman LLP

(57) ABSTRACT

Methods of dicing semiconductor wafers, each wafer having a plurality of integrated circuits, are described. In an example, a method of dicing a semiconductor wafer having a plurality of integrated circuits involves applying an adhesive layer to a front side of the semiconductor wafer. A mask layer is laminated onto the front side of the semiconductor wafer, the mask layer covering and protecting the integrated circuits. The adhesive layer adheres the mask layer to the front side of the semiconductor wafer. The mask layer is patterned with a laser scribing process to provide gaps in the mask layer, the gaps exposing regions of the semiconductor wafer between the integrated circuits. The semiconductor wafer is plasma etched through the gaps in the mask layer to singulate the integrated circuits.

15 Claims, 14 Drawing Sheets

(56) References Cited

U.S. PATENT DOCUMENTS

| | | |
|---|---|---|
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Powell |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0078800 A1* | 4/2010 | Aboush et al. ............... 257/692 |
| 2010/0248451 A1 | 9/2010 | Pirogovsky et al. |
| 2011/0312157 A1 | 12/2011 | Lei et al. |
| 2012/0322234 A1* | 12/2012 | Yalamanchili et al. ....... 438/462 |
| 2013/0045554 A1 | 2/2013 | Yamazaki |
| 2013/0065378 A1 | 3/2013 | Johnson et al. |
| 2013/0230972 A1 | 9/2013 | Johnson et al. |
| 2014/0004685 A1* | 1/2014 | Chowdhury et al. ......... 438/463 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

* cited by examiner $$I = \frac{E_p}{\pi \cdot w_0^2 \cdot \tau}$$

where $I$ is Intensity, $E_p$ is Pulse Energy, $w_0$ is Beam Radius, and $\tau$ is Pulse Width.

WAFER DICING USING HYBRID LASER SCRIBING AND PLASMA ETCH APPROACH WITH MASK APPLICATION BY VACUUM LAMINATION

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits involves applying an adhesive layer to a front side of the semiconductor wafer. A mask layer is laminated onto the front side of the semiconductor wafer, the mask layer covering and protecting the integrated circuits. The adhesive layer adheres the mask layer to the front side of the semiconductor wafer. The mask layer is patterned with a laser scribing process to provide gaps in the mask layer, the gaps exposing regions of the semiconductor wafer between the integrated circuits. The semiconductor wafer is plasma etched through the gaps in the mask layer to singulate the integrated circuits.

In another embodiment, a method of dicing a semiconductor wafer having a plurality of integrated circuits involves applying an adhesive layer to a mask layer. The mask layer is laminated onto a front side of the semiconductor wafer, the mask layer covering and protecting the integrated circuits. The adhesive layer adheres the mask layer to the front side of the semiconductor wafer. The mask layer is patterned with a laser scribing process to provide gaps in the mask layer, the gaps exposing regions of the semiconductor wafer between the integrated circuits. The semiconductor wafer is plasma etched through the gaps in the mask layer to singulate the integrated circuits.

In another embodiment, a method of dicing a semiconductor wafer having a plurality of integrated circuits involves providing the semiconductor wafer having a patterned mask layer laminated on a front side of the semiconductor wafer, the patterned mask layer covering and protecting the integrated circuits and having gaps exposing regions of the semiconductor wafer between the integrated circuits. An adhesive layer adheres the patterned mask layer to the front side of the semiconductor wafer. The method also involves plasma etching the semiconductor wafer through the gaps in the mask layer to singulate the integrated circuits.

DETAILED DESCRIPTION

Figure 1A:
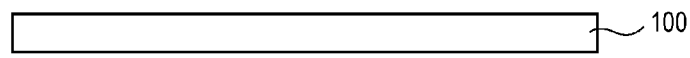
FIGS. 1A-1I illustrate cross-sectional views representing various operations in a method of dicing a semiconductor wafer including a plurality of integrated circuits, in accordance with an embodiment of the present invention.

Methods of dicing semiconductor wafers, each wafer having a plurality of integrated circuits thereon, are described. In the following description, numerous specific details are set forth, such as laser scribing, breakthrough etch, and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing. In an embodiment described herein, the mask layer is applied by vacuum lamination.

More particularly, one or more embodiments are directed to methods of using vacuum lamination processing for mask formation prior to laser scribing and plasma dicing. To provide context, laser and plasma combination dicing processes employ a mask, such as a water soluble, UV-curable or ashable mask. The mask may ultimately be used as a protection layer during the plasma etching portion of a die singulation process. There are several methods known for depositing the mask on the wafer, such as spin-on processing, printing processing, and vacuum lamination processing. However, spin-on and printing approaches for mask formation require that the depositing material (mask or mask precursor) be bubble-free. On the other hand, vacuum lamination processes rely on the use of a sheet of pre-fabricated long or short polymer compound. In the vacuum lamination approach, the formation of bubbles in the material may be avoided. However, bubbles can be formed between the wafer (e.g., Si wafer) front side and the mask material. Any such bubble formation during lamination may be problematic whether or not the mask is ultimately removed or is retained for later use as an underfill material.

Addressing one or more of the above issues, embodiments described herein are directed to improvements for vacuum lamination processes used to form a mask on a wafer prior to a die singulation scheme. Particular embodiments are directed to approaches for laminating a laminate film/mask on a semiconductor wafer that is not first supported by a tape frame wafer carrier assembly. Other particular embodiments are directed to approaches for laminating a laminate film/mask on a semiconductor wafer that is first supported by a tape frame wafer carrier assembly. Embodiments described herein may be applicable for any size of wafer used, e.g., in MEMS 200 mm, Flash and memory 300 mm, and future wafer 450 mm. In an exemplary embodiment, a lamination process involves first applying an adhesive (e.g., by spraying or) on wafer surface prior to lamination. After applying the adhesive, a laminate film is placed on the wafer and then laminated in a vacuum environment. The applied adhesive is used to maintain contact between the mask and the wafer during laser scribing and plasma processing.

In a first aspect, an adhesive is applied on a wafer surface and a mask layer is laminated thereon prior to placing the wafer on a wafer carrier. As an example, FIGS. 1A-1I illustrate cross-sectional views representing various operations in a method of dicing a semiconductor wafer including a plurality of integrated circuits, in accordance with an embodiment of the present invention.

Figure 1B:
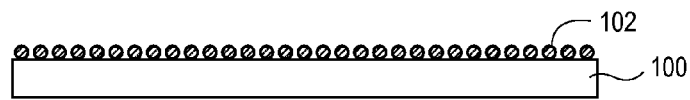
Figure 1C:
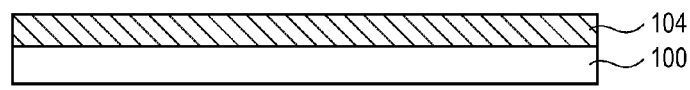
Figure 1D:
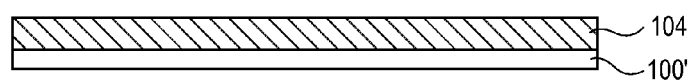
Figure 1E:
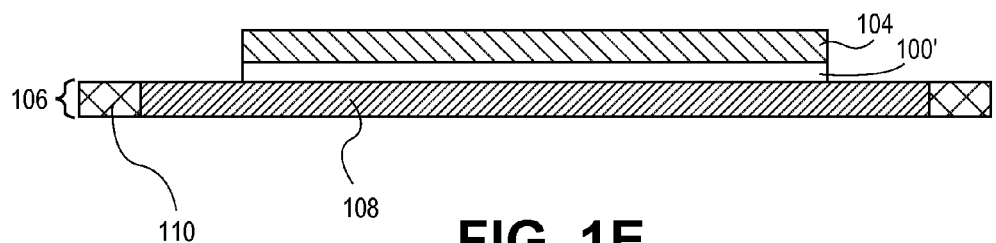
Figure 1F:
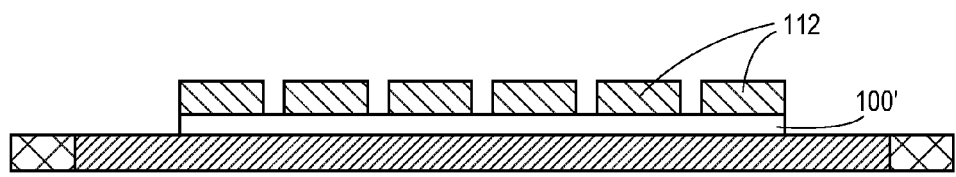
Figure 1G:
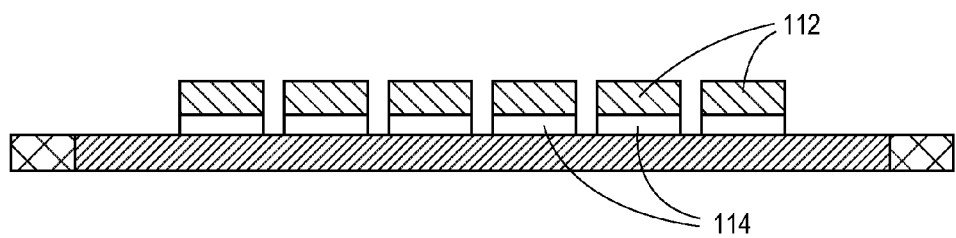
Figure 1H:
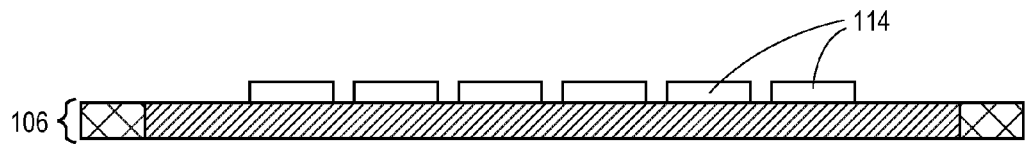
Figure 1I:

Referring to FIG. 1A, a wafer 100 is provided. An adhesive layer 102 is then applied to a front side of the wafer 100, as is depicted in FIG. 1B. Referring to FIG. 1C, a mask layer 104 is vacuum laminated onto the wafer 100 front side and is held in place with adhesive 102. A grind and polish of the backside of the wafer 100 may be used to provide a thinned wafer 100', as is depicted in FIG. 1D. Referring to FIG. 1E, the wafer 100' and mask 104 pairing is mounted on a substrate carrier 106. The substrate carrier 106 may include a dicing tape 108 supported by a tape frame 110, as is depicted in FIG. 1E. Referring to FIG. 1F, laser ablation of the mask 104 is performed to form a patterned mask 112. A plasma etch operation is then performed to singulate individual dies 114, such as individual integrated circuits, as is depicted in FIG. 1G. Referring to FIG. 1H, the patterned mask 112 is removed from the individual dies 114. Individual dies 114 may then be removed from the substrate carrier 106 in a die pick procedure, as is depicted in FIG. 1I.

In a second aspect, an adhesive is applied on a wafer surface and a mask layer is laminated thereon subsequent to placing the wafer on a wafer carrier. As an example, FIGS. 2A-2J illustrate cross-sectional views representing various operations in another method of dicing a semiconductor wafer including a plurality of integrated circuits, in accordance with another embodiment of the present invention.

Figure 2A:
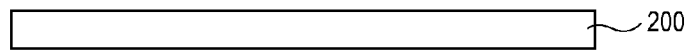
FIGS. 2A-2J illustrate cross-sectional views representing various operations in another method of dicing a semiconductor wafer including a plurality of integrated circuits, in accordance with another embodiment of the present invention.
Figure 2B:
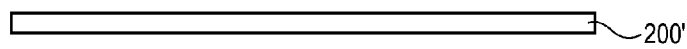
Figure 2C:
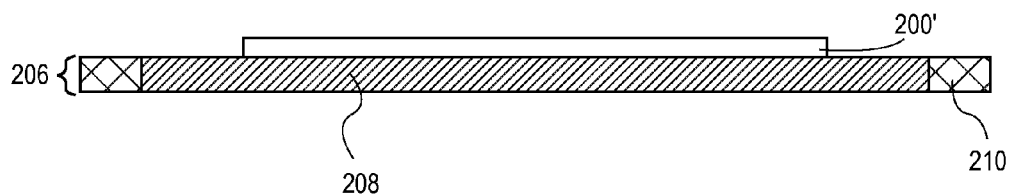
Figure 2D:
Figure 2E:
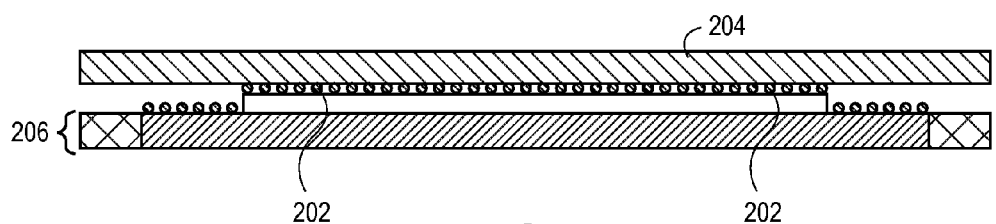
Figure 2F:
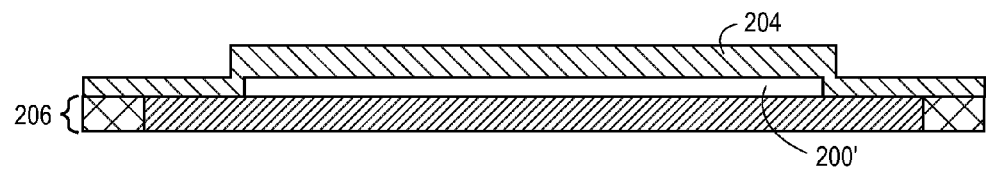
Figure 2G:
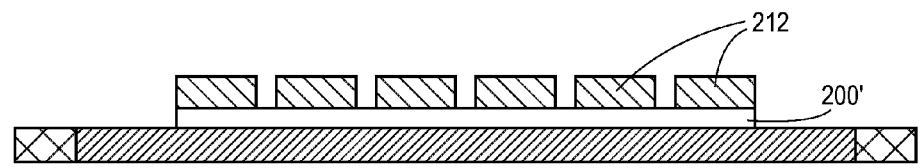
Figure 2H:
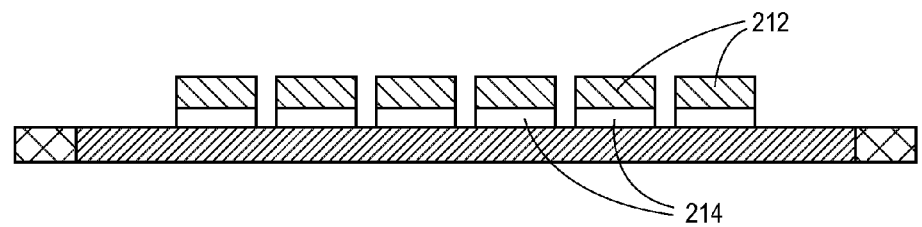
Figure 2I:
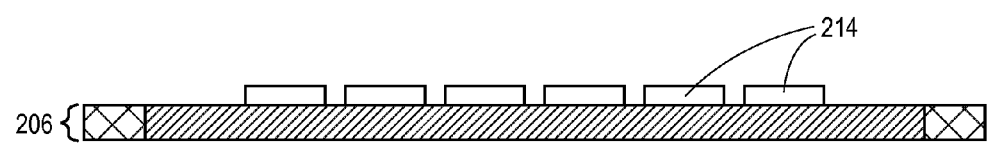
Figure 2J:

Referring to FIG. 2A, a wafer 200 is provided. A grind and polish of the backside of the wafer 200 may be used to provide a thinned wafer 200', as is depicted in FIG. 2B. Following the thinning process, a grinding tape, if present, may be removed, e.g., by a UV cure process. Referring to FIG. 2C, the wafer 200' is mounted on a substrate carrier 206. The substrate carrier 206 may include a dicing tape 208 supported by a tape frame 210, as is depicted in FIG. 2C. Referring to FIG. 2D, an adhesive layer 202 is then applied to a front side of the wafer 200'. It is to be appreciated that a portion of the adhesive layer 202 may also form on portions of the substrate carrier 206, as is depicted in FIG. 2D. Referring to FIG. 2E, a mask layer 204 is placed over the wafer 200' front side. Referring to FIG. 2F, the mask layer 204 is then vacuum laminated onto the wafer 200' front side and is held in place with adhesive 202. It is to be appreciated that a portion of the mask layer may also be adhered to the carrier 212, as is depicted in FIG. 2F. Referring to FIG. 2G, laser ablation of the mask 204 is performed to form a patterned mask 212. A plasma etch operation is then performed to singulate individual dies 214, such as individual integrated circuits, as is depicted in FIG. 2H. Referring to FIG. 2I, the patterned mask 212 is removed from the individual dies 214. Individual dies 214 may then be removed from the substrate carrier 206 in a die pick procedure, as is depicted in FIG. 2J.

In an embodiment, the wafer 100 or 200 may be one of, but is not limited to, a P-type or N-type doped silicon wafer having a diameter of 200 mm, 300 mm or 450 mm.

In an embodiment, the adhesive layer 102 or 202 is applied by a spray-on process, by rolling on, by an embossing process, or by wiping on. In an embodiment, the adhesive layer 102 or 202 is a UV curable adhesive material or a water-soluble adhesive material. It is to be appreciated that although the adhesive layer 102 or 202 is referred to as a "layer," the adhesive material applied by be a continuous film or may instead be a discontinuous film made up of balls or beads of the adhesive material.

In an embodiment, the adhesive layer 102 or 202 is a water-soluble material that is readily dissolvable in an aqueous media. For example, in one embodiment, the water-soluble material is soluble in one or more of an alkaline solution, an acidic solution, or in deionized water. In an embodiment, the water-soluble material maintains its water solubility upon exposure to a heating process, such as heating approximately in the range of 50-160 degrees Celsius. For example, in one embodiment, the water-soluble material is soluble in aqueous solutions following exposure to chamber conditions used in a laser and plasma etch singulation process. In one embodiment, the water-soluble material is a material such as, but not limited to, polyvinyl alcohol, polyacrylic acid, dextran, polymethacrylic acid, polyethylene imine, or polyethylene oxide.

In another embodiment, the adhesive layer 102 or 202 is a UV-curable material. In an embodiment, the UV-curable material has a susceptibility to UV light that reduces an adhesiveness of the UV-curable material by at least approximately 80%. In one such embodiment, the UV material is a polyvinyl chloride or an acrylic-based material. In an embodiment, the UV-curable adhesive material is sensitive to approximately 365 nm UV light. In one such embodiment, this sensitivity enables use of LED light to perform a cure.

In other embodiments, although not depicted, the adhesive layer 102 or 202 is first applied to a mask layer, and the mask layer with the adhesive material thereon is vacuum laminated to the wafer. In yet other embodiments, lamination of a mask layer with the aid of an adhesive layer may be applied to a backside of the wafer instead of to the front side of the wafer.

In an embodiment, mask layer removal may be performed by using a UV-curing process, an aqueous washing process, or an ashing process, as is described in greater detail below in association with mask layer 602.

To provide broader context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 3:
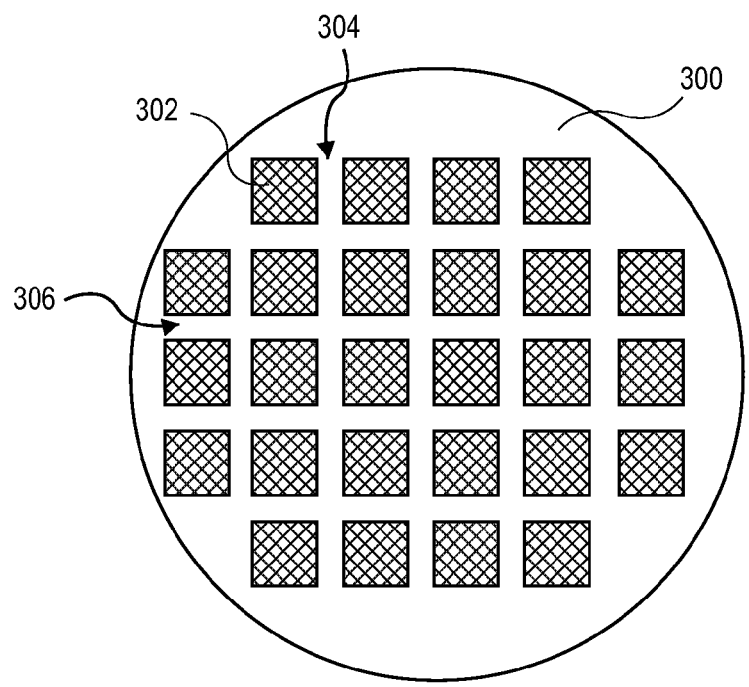
FIG. 3 illustrates a top plan of a semiconductor wafer to be diced, in accordance with an embodiment of the present invention.
Figure 4:
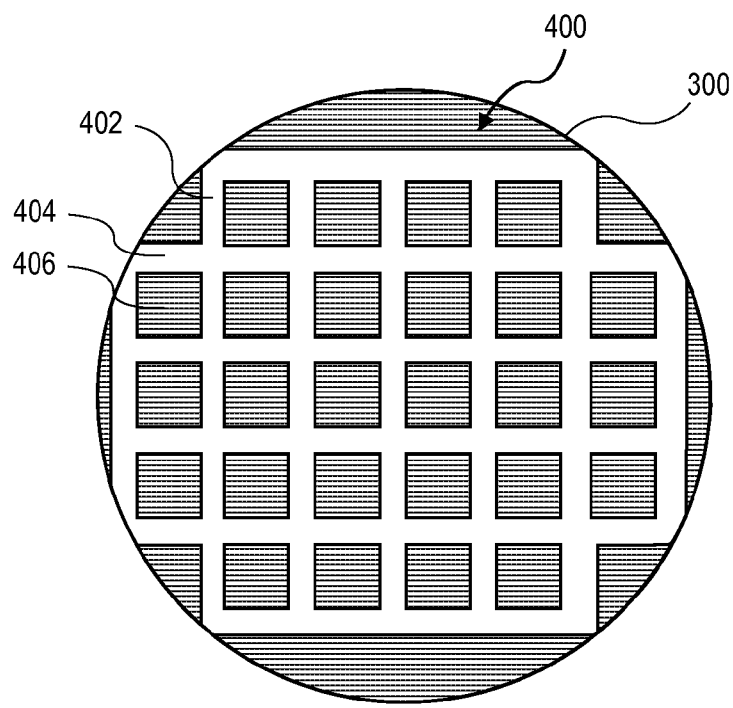
FIG. 4 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 3 illustrates a top plan of a semiconductor wafer to be diced, in accordance with an embodiment of the present invention. FIG. 4 illustrates a top plan of a semiconductor wafer to be diced that has a dicing mask formed thereon, in accordance with an embodiment of the present invention.

Referring to FIG. 3, a semiconductor wafer 300 has a plurality of regions 302 that include integrated circuits. The regions 302 are separated by vertical streets 304 and horizontal streets 306. The streets 304 and 306 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 4, the semiconductor wafer 300 has a mask 400 laminated upon the semiconductor wafer 300. The mask 400 and, possibly, a portion of the semiconductor wafer 300 are patterned with a laser scribing process to define the locations (e.g., gaps 402 and 404) along the streets 304 and 306 where the semiconductor wafer 300 will be diced. The integrated circuit regions of the semiconductor wafer 300 are covered and protected by the mask 400. The regions 406 of the mask 400 are positioned such that during a subsequent etching process, the integrated circuits are not degraded by the etch process. Accordingly, horizontal gaps 404 and vertical gaps 402 are formed between the regions 406 to define the areas that will be etched during the etching process to finally dice the semiconductor wafer 300.

Figure 5:
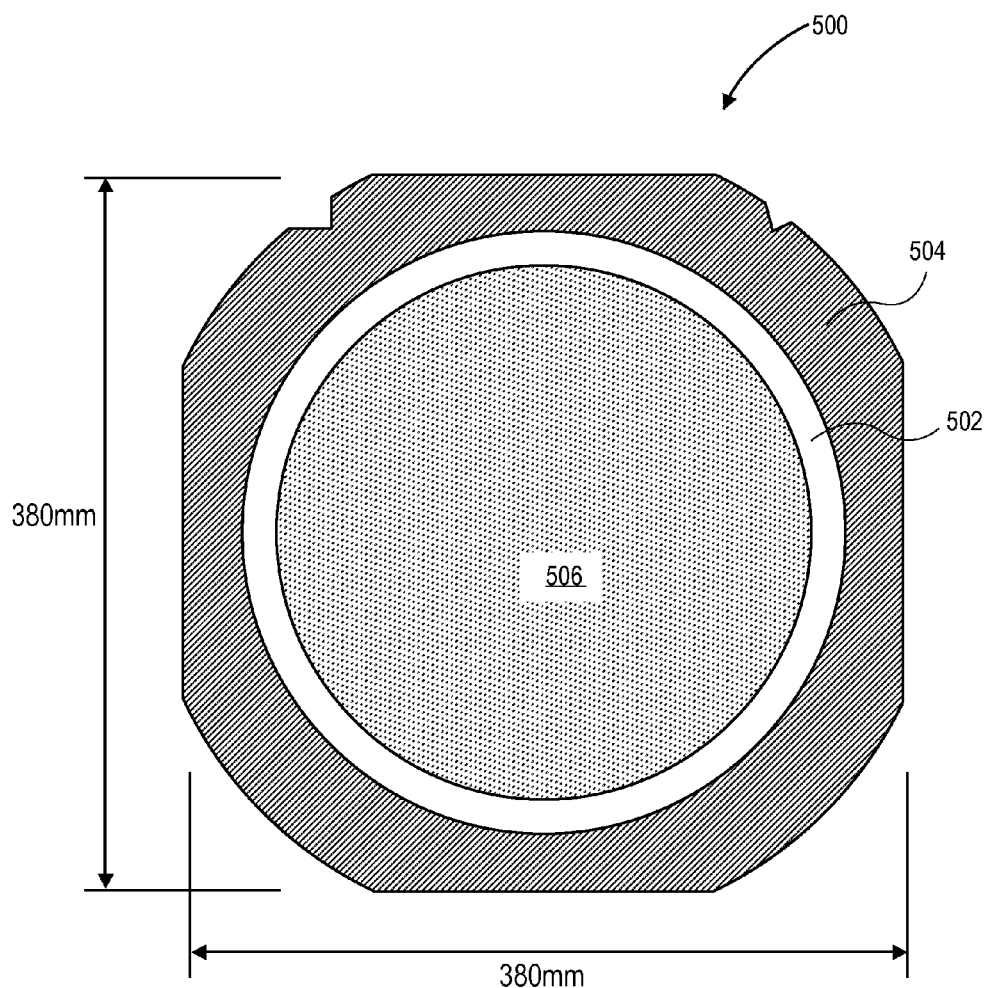
FIG. 5 illustrates a plan view of a substrate carrier suitable for supporting a wafer during a singulation process, in accordance with an embodiment of the present invention.

FIG. 5 illustrates a plan view of a substrate carrier suitable for supporting a wafer during a singulation process, in accordance with an embodiment of the present invention. Referring to FIG. 5, a substrate carrier 500 includes a layer of backing tape 502 surrounded by a tape ring or frame 504. A wafer or substrate 506 is supported by the backing tape 502 of the substrate carrier 500. In one embodiment, the wafer or substrate 506 is attached to the backing tape 502 by a die attach film. In one embodiment, the tape ring or frame 504 is composed of stainless steel.

In an embodiment, a singulation process can be accommodated in a system sized to receive a substrate carrier such as the substrate carrier 500. In one such embodiment, a system such as system 1200, described in greater detail below, can accommodate a wafer frame without impact on the system footprint that is otherwise sized to accommodate a substrate or wafer not supported by a substrate carrier. In one embodiment, such a processing system is sized to accommodate 300 millimeter-in-diameter wafers or substrates. The same system can accommodate a wafer carrier approximately 380 millimeters in width by 380 millimeters in length, as depicted in FIG. 5. However, it is to be appreciated that systems may be designed to handle 200 or 450 millimeter wafers or substrates or, more particularly, 200 or 450 millimeter wafer or substrate carriers.

Figure 6A:
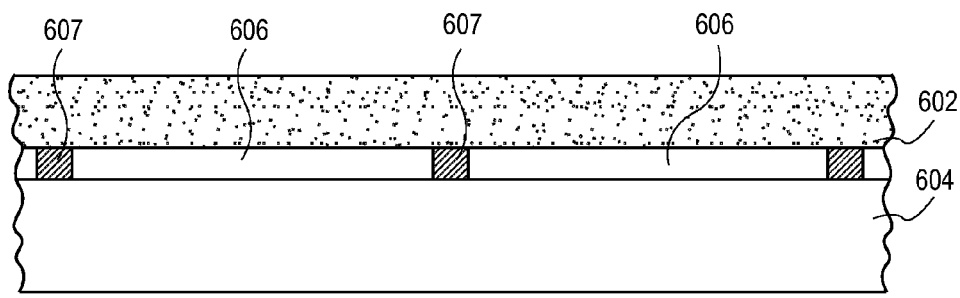
FIGS. 6A-6C illustrate cross-sectional views of a semiconductor wafer including a plurality of integrated circuits during performing of a method of dicing the semiconductor wafer, in accordance with an embodiment of the present invention.
Figure 6B:
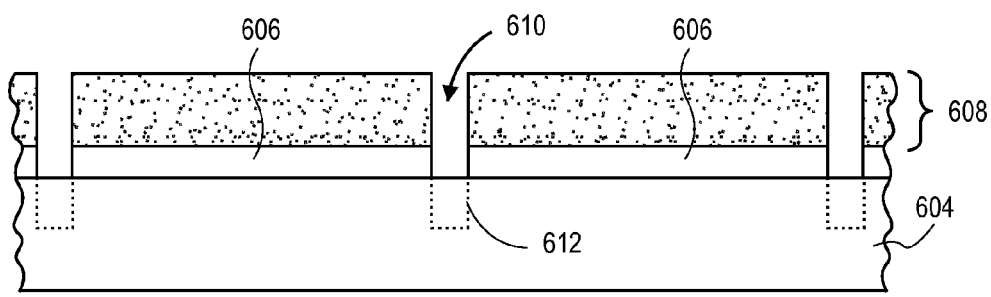
Figure 6C:
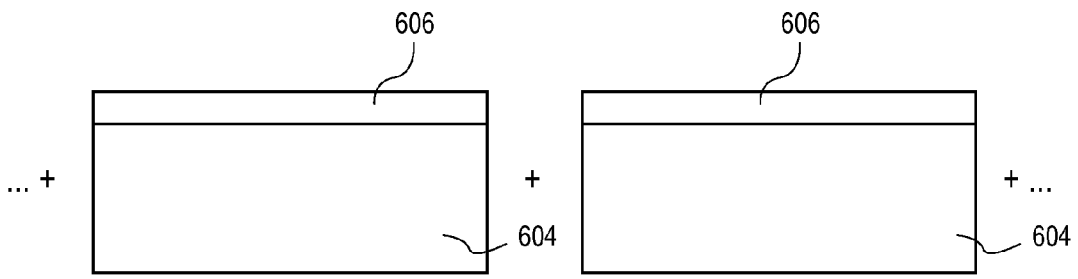

FIGS. 6A-6C illustrate cross-sectional views of a semiconductor wafer including a plurality of integrated circuits during performing of a method of dicing the semiconductor wafer, in accordance with an embodiment of the present invention.

Referring FIG. 6A, a mask 602 is laminated above a semiconductor wafer or substrate 604. The mask 602 is composed of a layer covering and protecting integrated circuits 606 formed on the surface of semiconductor wafer 604. The mask 602 also covers intervening streets 607 formed between each of the integrated circuits 606.

In an embodiment, the mask 602 is laminated using an adhesive layer, as described in association with FIGS. 1A-1I and 2A-2J. In an embodiment, the mask 602 is a water-soluble, ashable or UV-curable masking material. It is to be appreciated that a same material may be both water-soluble and ashable or both UV-curable and ashable.

In an embodiment, laminating the mask 602 onto the substrate or wafer 604 involves laminating a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, laminating the mask 602 onto the substrate or wafer 604 involves laminating a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 604 is composed of a material suitable to withstand a fabrication process and upon which semiconductor processing layers may suitably be disposed. For example, in one embodiment, semiconductor wafer or substrate 604 is composed of a group IV-based material such as, but not limited to, crystalline silicon, germanium or silicon/germanium. In a specific embodiment, providing semiconductor wafer 604 includes providing a monocrystalline silicon substrate. In a particular embodiment, the monocrystalline silicon substrate is doped with impurity atoms. In another embodiment, semiconductor wafer or substrate 604 is composed of a material such as, e.g., a material substrate used in the fabrication of light emitting diodes (LEDs).

In an embodiment, semiconductor wafer or substrate 604 has disposed thereon or therein, as a portion of the integrated circuits 606, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 606. Materials making up the streets 607 may be similar to or the same as those materials used to form the integrated circuits 606. For example, streets 607 may be composed of layers of dielectric materials, semiconductor materials, and metallization. In one embodiment, one or more of the streets 607 includes test devices similar to the actual devices of the integrated circuits 606.

In an embodiment, following lamination of the mask layer 602 onto the wafer or substrate 604, a mask plasma treatment is performed for improving mask etch resistance. In one such embodiment, the plasma treatment process is performed prior to patterning the mask 602 with a laser scribing process such as described below in association with FIG. 6B. That is, the plasma treatment process is performed between the processes depicted in FIGS. 6A and 6B. In another such embodiment, however, the plasma treatment process is performed subsequent to patterning the mask 602 with a laser scribing process such as described below in association with FIG. 6B. That is, the plasma treatment process is performed between the processes depicted in FIGS. 6B and 6C. In either case, however, the mask plasma treatment is performed prior to performing the substrate plasma etch for die singulation such as described in association with FIG. 6C.

In an embodiment, the mask plasma treatment involves exposing the mask 602 to a plasma based on argon (Ar) gas, nitrogen ($N_2$) gas, or a combination of Ar and $N_2$ gas. In one such embodiment, the plasma source power is approximately in the range of 2000 W to 4500 W, the bias power is approximately in the range of 1000 W to 2000 W, and gas pressure is approximately in the range of 100 mTorr to 250 mTorr. Process time is approximately in the range of 30 seconds to 90 seconds. In an embodiment, so long as the source/bias power is not high enough as to cause plasma etching removal of the mask due to over-strong bombardment, higher source and bias power is preferred since shorter process times may be used to achieve a mask "hardening" effect.

Referring to FIG. 6B, the mask 602 is patterned with a laser scribing process to provide a patterned mask 608 with gaps 610, exposing regions of the semiconductor wafer or substrate 604 between the integrated circuits 606. As such, the laser scribing process is used to remove the material of the streets 607 originally formed between the integrated circuits 606. In accordance with an embodiment of the present invention, patterning the mask 602 with the laser scribing process includes forming trenches 612 partially into the regions of the semiconductor wafer 604 between the integrated circuits 606, as depicted in FIG. 6B.

In an embodiment, patterning the mask 606 with the laser scribing process includes using a laser having a pulse width in the femtosecond range, i.e., a femtosecond-based laser scribing process is used. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 602, the streets 607 and, possibly, a portion of the semiconductor wafer or substrate 604.

Figure 7:
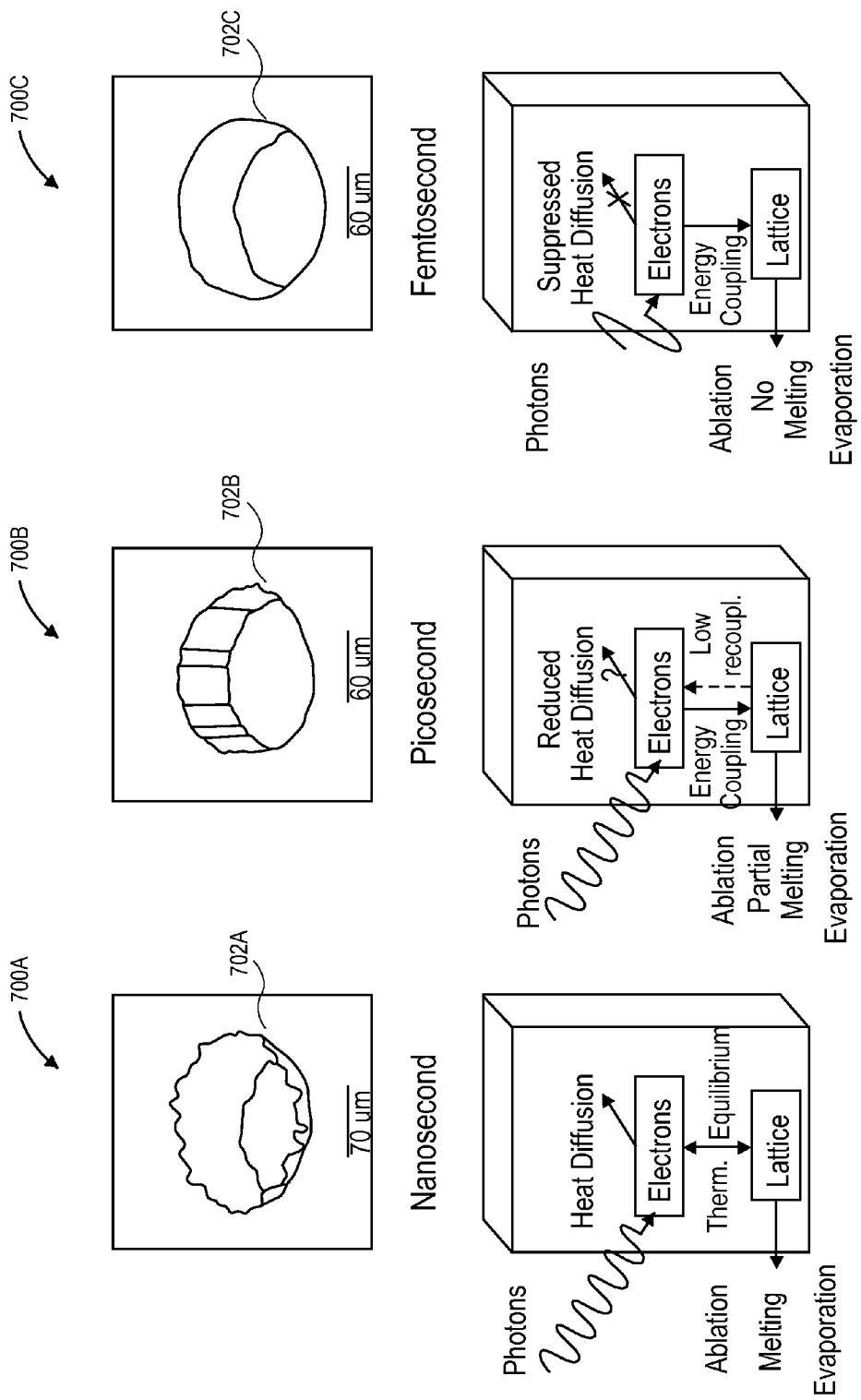
FIG. 7 illustrates the effects of using a laser pulse in the femtosecond range versus longer pulse times, in accordance with an embodiment of the present invention.

FIG. 7 illustrates the effects of using a laser pulse in the femtosecond range versus longer frequencies, in accordance with an embodiment of the present invention. Referring to FIG. 7, by using a laser with a pulse width in the femtosecond range heat damage issues are mitigated or eliminated (e.g., minimal to no damage 702C with femtosecond processing of a via 700C) versus longer pulse widths (e.g., damage 702B with picosecond processing of a via 700B and significant damage 702A with nanosecond processing of a via 700A). The elimination or mitigation of damage during formation of via 700C may be due to a lack of low energy recoupling (as is seen for picosecond-based laser ablation) or thermal equilibrium (as is seen for nanosecond-based laser ablation), as depicted in FIG. 7.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 8 illustrates a cross-sectional view of a stack of materials that may be used in a street region of a semiconductor wafer or substrate, in accordance with an embodiment of the present invention.

Figure 8:
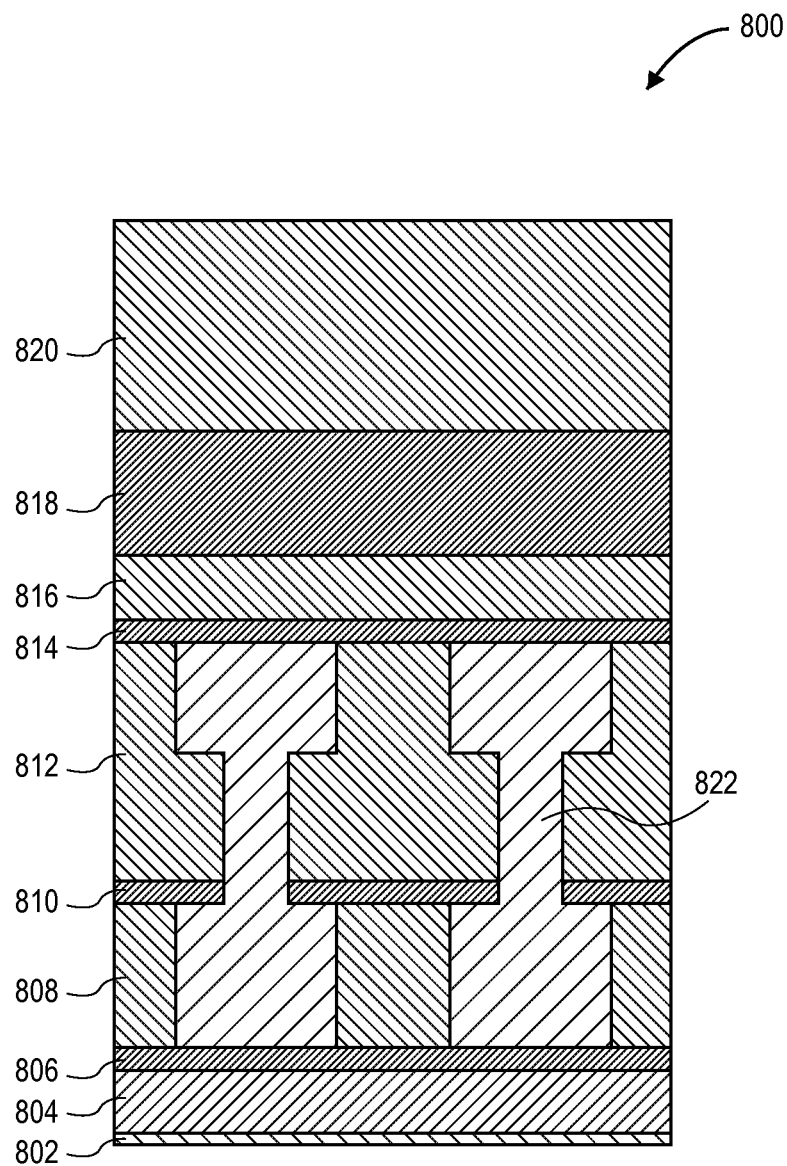
FIG. 8 illustrates a cross-sectional view of a stack of materials that may be used in a street region of a semiconductor wafer or substrate, in accordance with an embodiment of the present invention.

Referring to FIG. 8, a street region 800 includes the top portion 802 of a silicon substrate, a first silicon dioxide layer 804, a first etch stop layer 806, a first low K dielectric layer 808 (e.g., having a dielectric constant of less than the dielectric constant of 4.0 for silicon dioxide), a second etch stop layer 810, a second low K dielectric layer 812, a third etch stop layer 814, an undoped silica glass (USG) layer 816, a second silicon dioxide layer 818, and a laminated mask layer 820, with possible relative thicknesses depicted. Copper metallization 822 is disposed between the first and third etch stop layers 806 and 814 and through the second etch stop layer 810. In a specific embodiment, the first, second and third etch stop layers 806, 810 and 814 are composed of silicon nitride, while low K dielectric layers 808 and 812 are composed of a carbon-doped silicon oxide material.

Figures 9, 10:
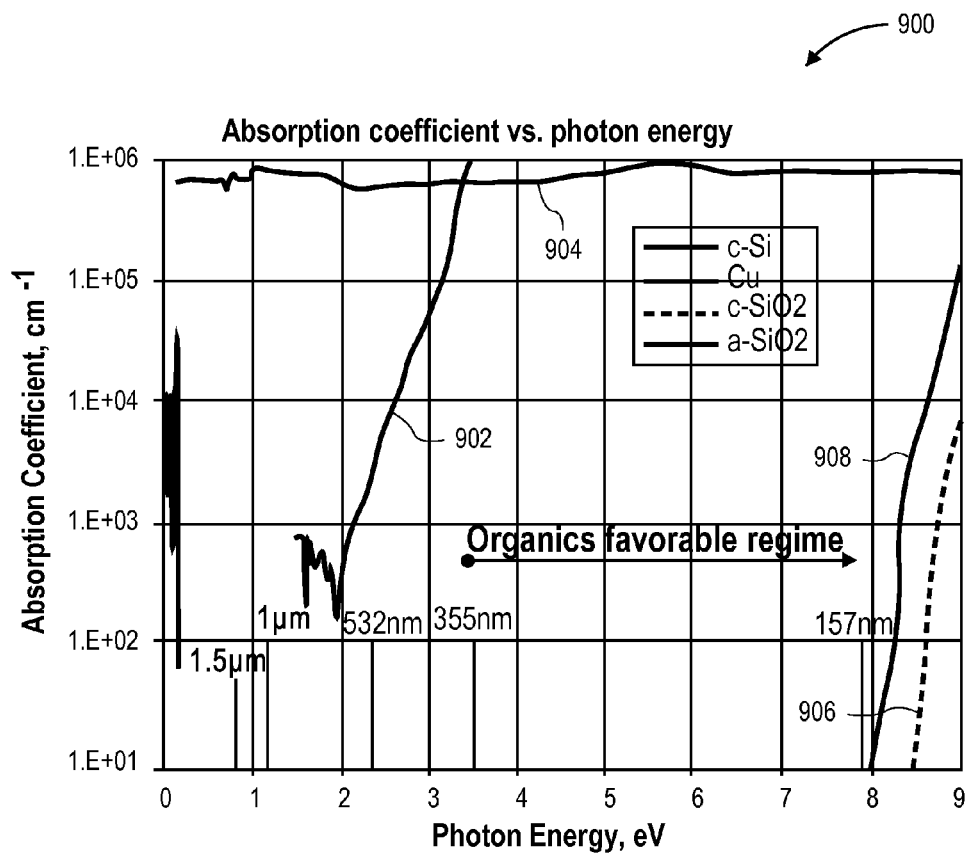
FIG. 9 includes a plot of absorption coefficient as a function of photon energy for crystalline silicon (c-Si), copper (Cu), crystalline silicon dioxide (c-$SiO_2$), and amorphous silicon dioxide (a-$SiO_2$), in accordance with an embodiment of the present invention.
FIG. 10 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 800 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 9 includes a plot 900 of absorption coefficient as a function of photon energy for crystalline silicon (c-Si, 902), copper (Cu, 904), crystalline silicon dioxide (c-SiO$_2$, 906), and amorphous silicon dioxide (a-SiO$_2$, 908), in accordance with an embodiment of the present invention. FIG. 10 is an equation 1000 showing the relationship of laser intensity for a given laser as a function of laser pulse energy, laser pulse width, and laser beam radius.

Using equation 1000 and the plot 900 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a mask, a street, and a portion of a silicon substrate.

By contrast, if non-optimal laser parameters are selected, in a stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring again to FIG. 6B, an intermediate post mask-opening cleaning operation may optionally performed following the laser scribing but prior to the plasma etching described below in association with FIG. 6C. In an embodiment, the post mask-opening cleaning operation is a plasma-based cleaning process. In a first example, as described below, the plasma-based cleaning process is reactive to the regions of the substrate 604 exposed by the gaps 610. In the case of a reactive plasma-based cleaning process, the cleaning process itself may form or extend trenches 612 in the substrate 604 since the reactive plasma-based cleaning operation is at least somewhat of an etchant for the substrate 604. In a second, different, example, as is also described below, the plasma-based cleaning process is non-reactive to the regions of the substrate 604 exposed by the gaps 610.

In accordance with a first embodiment, the plasma-based cleaning process is non-reactive to exposed regions of the substrate 604 in that the exposed regions are not or only negligible etched during the cleaning process. In one such embodiment, only non-reactive gas plasma cleaning is used. For example, Ar or another non-reactive gas (or the mix) is used to perform a highly-biased plasma treatment both for mask condensation and cleaning of scribed openings.

In accordance with a second embodiment, the plasma-based cleaning process is reactive to exposed regions of the substrate 604 in that the exposed regions are partially etched during the cleaning process. In one such embodiment, Ar or another non-reactive gas (or the mix) is combined with $SF_6$ for a highly-biased plasma treatment for cleaning of scribed openings. The plasma treatment using mixed gases Ar+$SF_6$ under high-bias power is performed for bombarding mask-opened regions to achieve cleaning of the mask-opened regions. In the reactive breakthrough process, both physical bombardment from Ar and $SF_6$ along with chemical etching due to $SF_6$ and F-ions contribute to cleaning of mask-opened regions.

Referring to FIG. 6C, the semiconductor wafer 604 is etched through the gaps 610 in the patterned mask 608 to singulate the integrated circuits 606. In accordance with an embodiment of the present invention, etching the semiconductor wafer 604 includes etching the trenches 612 formed with the laser scribing process (and possibly extended with a reactive post-mask-opening clean operation) to ultimately etch entirely through semiconductor wafer 604, as depicted in FIG. 6C. In an embodiment, the mask layer 608 is removed after the singulation process, as depicted in FIG. 6C.

In an embodiment, etching the semiconductor wafer 604 includes using a plasma etching process. In one embodiment, a through-silicon via type etch process is used. For example, in a specific embodiment, the etch rate of the material of semiconductor wafer 604 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 604 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In another embodiment, the plasma etching operation described in association with FIG. 6C employs a conventional Bosch-type dep/etch/dep process to etch through the substrate 604. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which may be rough. This is particularly the effect where the laser scribing process generates an open trench much rougher than that which a lithographically defined etch process achieves. Such a rough die edge leads to lower than expected die break strength. In addition, the deposition sub-step in a Bosch process generates a Flourine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, the integrated circuits are in singulated form. Subsequently, in an embodiment, an isotropic chemical wet or plasma etch is applied to smoothen the sidewall by gently etching a thin layer of substrate (e.g., silicon) off the sidewall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (~0.15 um/min) so the smoothening treatment is more controllable. The high bias power is applied to achieve relatively high directional etch rates to etch off the ridges or rims on the sidewall.

Accordingly, referring again to FIGS. 6A-6C, wafer dicing may be preformed by initial laser ablation through a mask layer, through wafer streets (including metallization), and partially into a silicon substrate. The laser pulse width may be selected in the femtosecond range. Die singulation may then be completed by subsequent through-silicon deep plasma etching. A plasma treatment may be performed on the mask layer prior to or subsequent to the laser ablation, but prior to the through-silicon deep plasma etching. A specific example of a materials stack for dicing is described below in association with FIGS. 11A-11D, in accordance with an embodiment of the present invention.

Figure 11A:
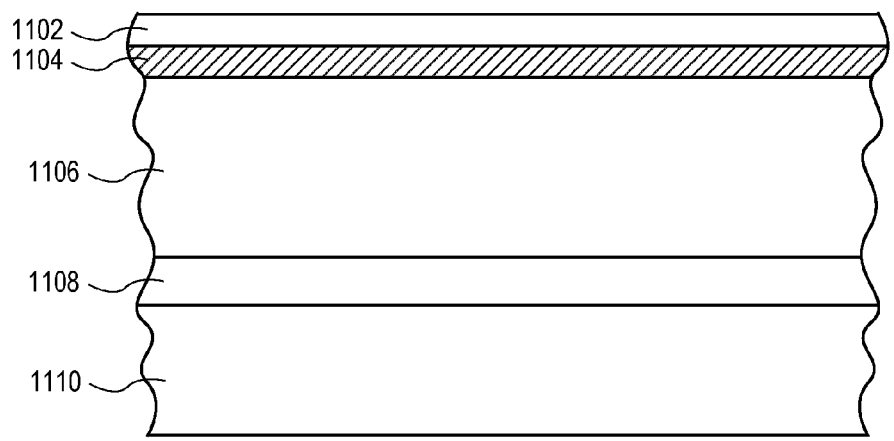
FIGS. 11A-11D illustrate cross-sectional views of various operations in a method of dicing a semiconductor wafer, in accordance with an embodiment of the present invention.

Referring to FIG. 11A, a materials stack for hybrid laser ablation and plasma etch dicing includes a mask layer 1102, a device layer 1104, and a substrate 1106. The mask layer, device layer, and substrate are disposed above a die attach film 1108 which is affixed to a backing tape 1110. In an embodiment, the mask layer 1102 is a laminated mask layer, as described above in association with FIGS. 1A-1I and 2A-2J. The device layer 1104 includes an inorganic dielectric layer (such as silicon dioxide) disposed above one or more metal layers (such as copper layers) and one or more low K dielectric layers (such as carbon-doped oxide layers). The device layer 1104 also includes streets arranged between integrated circuits, the streets including the same or similar layers to the integrated circuits. The substrate 1106 is a bulk single-crystalline silicon substrate.

In an embodiment, the bulk single-crystalline silicon substrate 1106 is thinned from the backside prior to being affixed to the die attach film 1108. The thinning may be performed by a backside grind process. In one embodiment, the bulk single-crystalline silicon substrate 1106 is thinned to a thickness approximately in the range of 50-100 microns. It is important to note that, in an embodiment, the thinning is performed prior to a laser ablation, plasma cleaning, and plasma etch dicing process. In an embodiment, the mask layer 1102 has a thickness of approximately 20 microns and the device layer 1104 has a thickness approximately in the range of 2-3 microns. In an embodiment, the die attach film 1108 (or any suitable substitute capable of bonding a thinned or thin wafer or substrate to the backing tape 1110) has a thickness of approximately 20 microns.

Figure 11B:
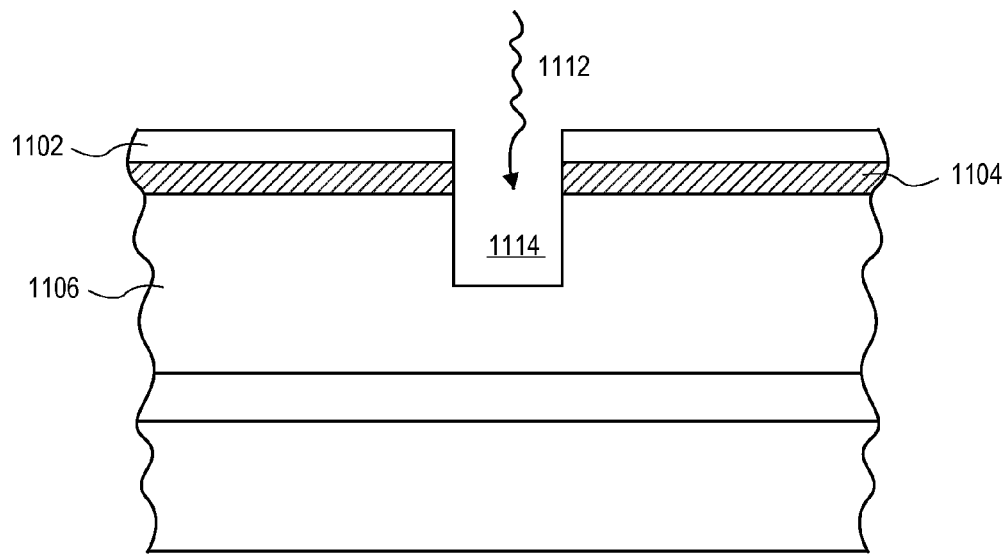
Figure 11C:
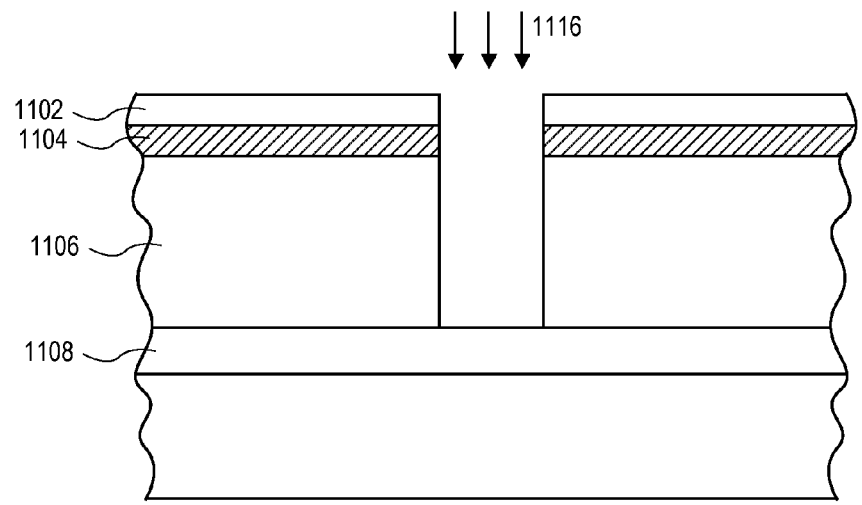

Referring to FIG. 11B, the mask 1102, the device layer 1104 and a portion of the substrate 1106 are patterned with a laser scribing process, such as a femtosecond-based laser scribing process, 1112, to form trenches 1114 in the substrate 1106. Referring to FIG. 11C, a through-silicon deep plasma etch process 1116 is used to extend the trench 1114 down to the die attach film 1108, exposing the top portion of the die attach film 1108 and singulating the silicon substrate 1106. In an embodiment, the device layer 1104 is protected by the plasma-treated mask layer 1102 during the through-silicon deep plasma etch process 1116.

Figure 11D:
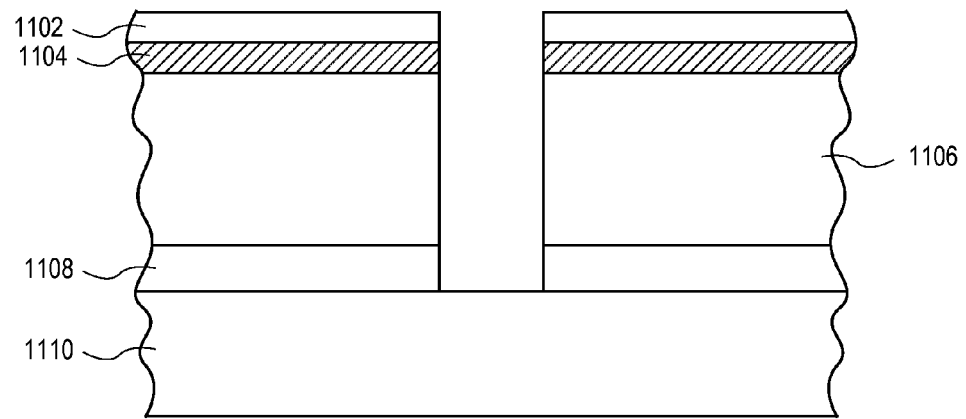

Referring to FIG. 11D, the singulation process may further include patterning the die attach film 1108, exposing the top portion of the backing tape 1110 and singulating the die attach film 1108. In an embodiment, the die attach film is singulated by a laser process or by an etch process. Further embodiments may include subsequently removing the singulated portions of substrate 1106 (e.g., as individual integrated circuits) from the backing tape 1110. In one embodiment, the singulated die attach film 1108 is retained on the back sides of the singulated portions of substrate 1106. Other embodiments may include removing the masking layer 1102 from the device layer 1104. In an embodiment, the singulated integrated circuits are removed from the backing tape 1110 for packaging. In one such embodiment, the patterned die attach film 1108 is retained on the backside of each integrated circuit and included in the final packaging. However, in another embodiment, the patterned die attach film 1108 is removed during or subsequent to the singulation process.

A single process tool may be configured to perform many or all of the operations in a hybrid laser ablation and plasma etch singulation process. For example, FIG. 12 illustrates a block diagram of a tool layout for laser and plasma dicing of wafers or substrates, in accordance with an embodiment of the present invention.

Figure 12:
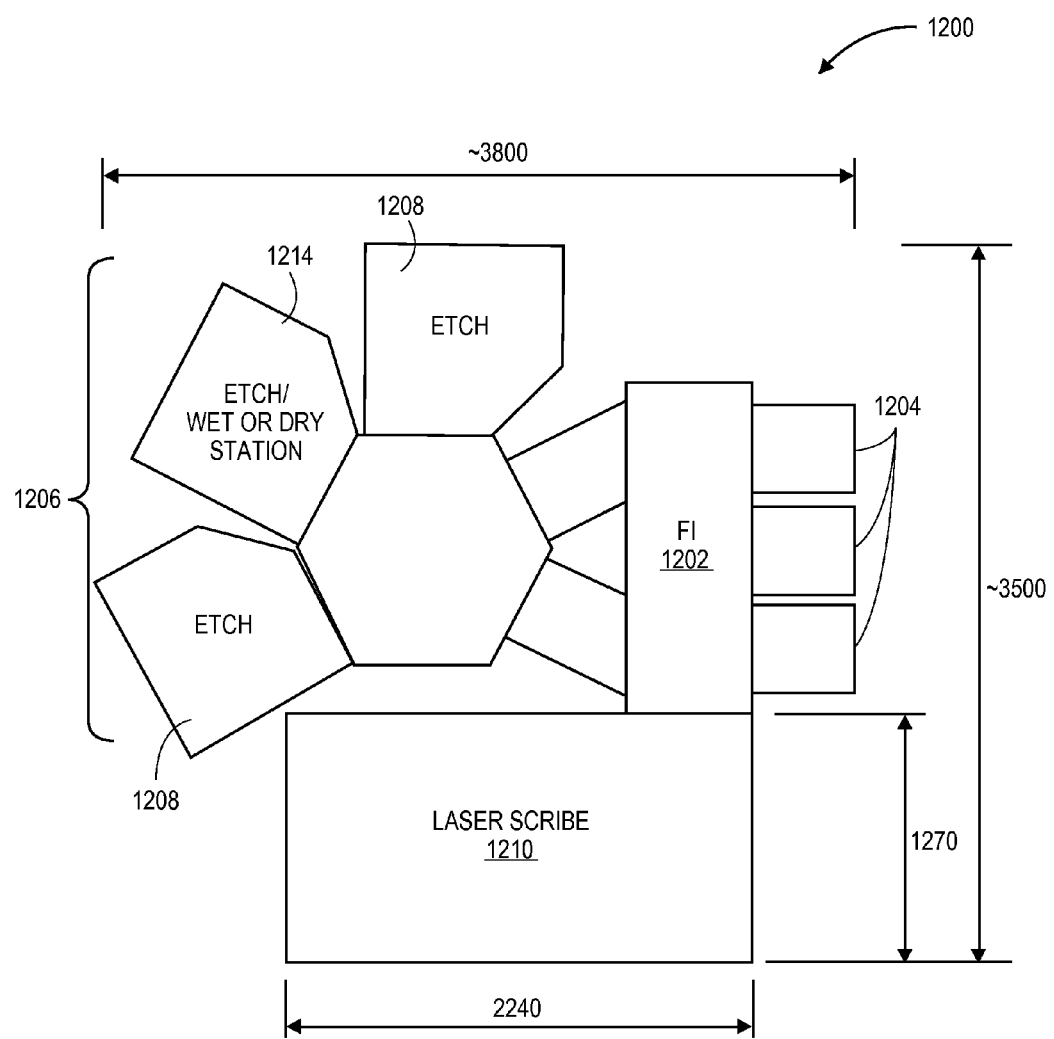
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chambers 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12.

In an embodiment, the one or more plasma etch chambers 1208 are configured for etching a wafer or substrate through the gaps in a patterned mask to singulate a plurality of integrated circuits. In one such embodiment, the one or more plasma etch chambers 1208 are configured to perform a deep silicon etch process. In a specific embodiment, the one or more plasma etch chambers 1208 are Applied Centura® Silvia™ Etch systems, available from Applied Materials of Sunnyvale, Calif., USA. The etch chambers may be specifically designed for a deep silicon etch used to create singulate integrated circuits housed on or in single crystalline silicon substrates or wafers. In an embodiment, a high-density plasma source is included in the plasma etch chambers 1208 to facilitate high silicon etch rates. In an embodiment, more than one etch chamber is included in the cluster tool 1206 portion of process tool 1200 to enable high manufacturing throughput of the singulation or dicing process, as is depicted.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, a wet/dry station 1214 is included. The wet/dry station may be suitable for cleaning residues and fragments, or for removing a mask subsequent to a laser scribe and plasma etch singulation process of a substrate or wafer. In an embodiment, a metrology station is also included as a component of process tool 1200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 12. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 13:
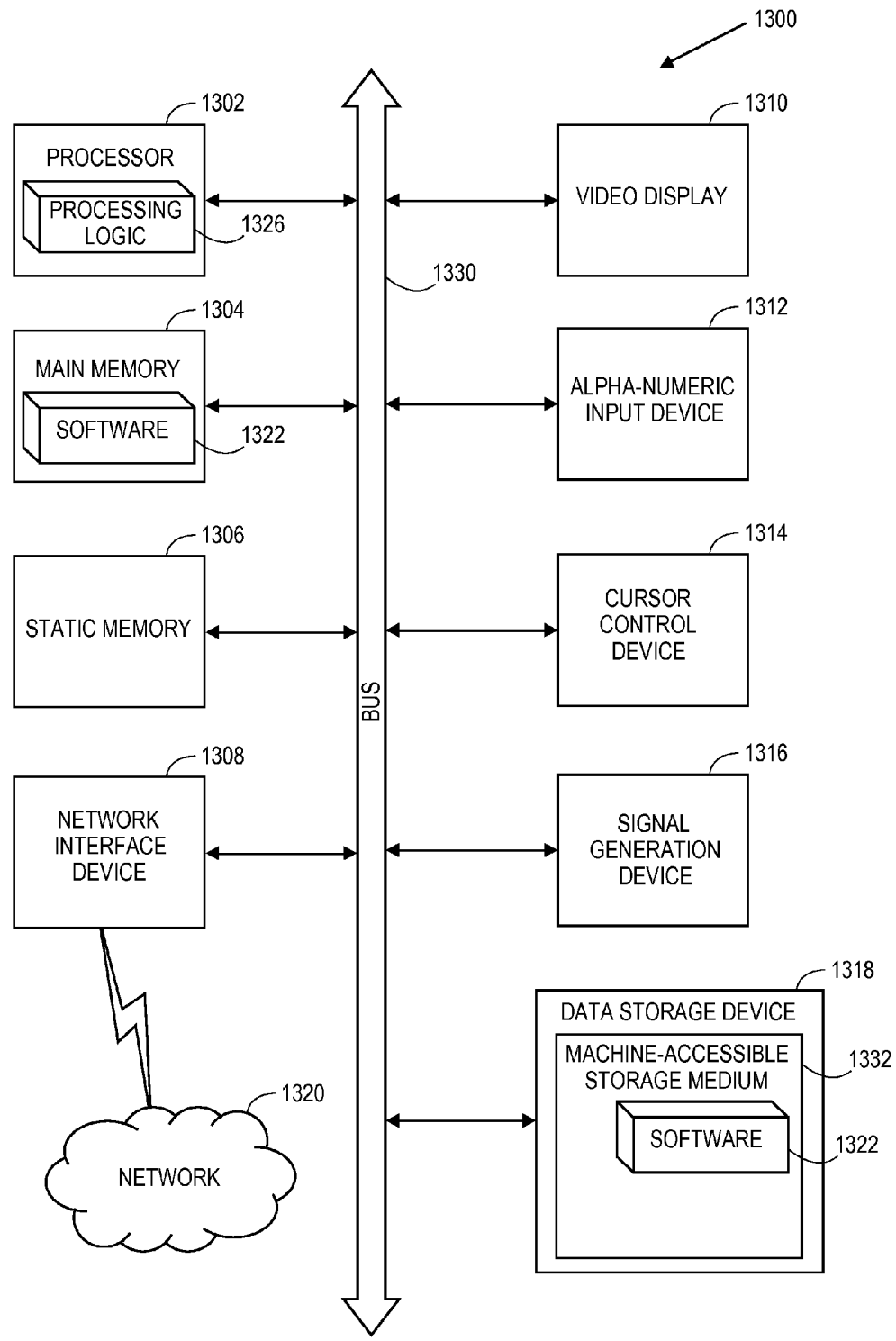
FIG. 13 illustrates a block diagram of an exemplary computer system, in accordance with an embodiment of the present invention.

FIG. 13 illustrates a diagrammatic representation of a machine in the exemplary form of a computer system 1300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations described herein.

The computer system 1300 may further include a network interface device 1308. The computer system 1300 also may include a video display unit 1310 (e.g., a liquid crystal display (LCD), a light emitting diode display (LED), or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1332 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1332 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves applying an adhesive layer to a front side of the semiconductor wafer. A mask layer is laminated onto the front side of the semiconductor wafer, the mask layer covering and protecting the integrated circuits. The adhesive layer adheres the mask layer to the front side of the semiconductor wafer. The mask layer is patterned with a laser scribing process to provide gaps in the mask layer, the gaps exposing regions of the semiconductor wafer between the integrated circuits. The semiconductor wafer is plasma etched through the gaps in the mask layer to singulate the integrated circuits.

Thus, methods of dicing semiconductor wafers, each wafer having a plurality of integrated circuits, have been disclosed.

What is claimed is:

1. A method of dicing a semiconductor wafer comprising a plurality of integrated circuits, the method comprising:
    applying only an adhesive layer to a front side of the semiconductor wafer;
    subsequent to applying only the adhesive layer, laminating a mask layer onto the front side of the semiconductor wafer, the mask layer covering and protecting the integrated circuits, wherein the adhesive layer adheres the mask layer to the front side of the semiconductor wafer;
    patterning the mask layer with a laser scribing process to provide gaps in the mask layer, the gaps exposing regions of the semiconductor wafer between the integrated circuits; and
    plasma etching the semiconductor wafer through the gaps in the mask layer to singulate the integrated circuits, wherein the adhesive layer maintains contact between the semiconductor wafer and the mask layer during the laser scribing process and during the plasma etching.

2. The method of claim 1, wherein applying the adhesive layer to the front side of the semiconductor wafer comprises applying an adhesive material to the front side of the semiconductor wafer.

3. The method of claim 1, wherein applying the adhesive layer to the front side of the semiconductor wafer comprises applying a water-soluble or a UV-curable adhesive material to the front side of the semiconductor wafer.

4. The method of claim 1, wherein laminating the mask layer onto the front side of the semiconductor wafer comprises vacuum laminating the mask layer onto the front side of the semiconductor wafer.

5. The method of claim 1, further comprising:
    subsequent to plasma etching the semiconductor wafer, removing the mask layer by a process selected from the group consisting of a UV-curing process, an aqueous washing process, and an ashing process.

6. The method of claim 1, further comprising:
    subsequent to laminating the mask layer onto the front side of the semiconductor wafer and prior to patterning the mask layer with the laser scribing process, placing the semiconductor wafer on a substrate carrier.

7. The method of claim 1, further comprising:
    prior to applying the adhesive layer to the front side of the semiconductor wafer, placing the semiconductor wafer on a substrate carrier.

8. The method of claim 1, wherein patterning the mask layer with the laser scribing process comprises forming trenches in the regions of the semiconductor wafer between the integrated circuits, and wherein plasma etching the semiconductor wafer comprises extending the trenches to form corresponding trench extensions.

9. The method of claim 8, wherein each of the trenches has a width, and wherein each of the corresponding trench extensions has the width.

10. A method of dicing a semiconductor wafer comprising a plurality of integrated circuits, the method comprising:
    placing the semiconductor wafer on a substrate carrier;
    subsequent to placing the semiconductor wafer on the substrate carrier, applying only an adhesive layer to a front side of the semiconductor wafer and to a portion of a dicing tape of the substrate carrier;
    subsequent to applying only the adhesive layer, laminating a mask layer onto the front side of the semiconductor wafer, the mask layer covering and protecting the integrated circuits, wherein the adhesive layer adheres the mask layer to the front side of the semiconductor wafer and to the portion of the dicing tape of the substrate carrier;
    subsequent to laminating the mask layer, patterning the mask layer with a laser scribing process to provide gaps in the mask layer, the gaps exposing regions of the semiconductor wafer between the integrated circuits; and
    plasma etching the semiconductor wafer through the gaps in the mask layer to singulate the integrated circuits, wherein the adhesive layer maintains contact between the semiconductor wafer and the mask layer during the laser scribing process and during the plasma etching.

11. The method of claim 10, wherein applying the adhesive layer to the front side of the semiconductor wafer and to the portion of a dicing tape of the substrate carrier comprises applying a water-soluble or a UV-curable adhesive material to the front side of the semiconductor wafer and to the portion of a dicing tape of the substrate carrier.

12. The method of claim 10, wherein laminating the mask layer onto the front side of the semiconductor wafer comprises vacuum laminating the mask layer onto the front side of the semiconductor wafer.

13. The method of claim 10, further comprising:
    subsequent to plasma etching the semiconductor wafer, removing the mask layer by a process selected from the group consisting of a UV-curing process, an aqueous washing process, and an ashing process.

14. The method of claim 10, wherein patterning the mask layer with the laser scribing process comprises forming trenches in the regions of the semiconductor wafer between the integrated circuits, and wherein plasma etching the semiconductor wafer comprises extending the trenches to form corresponding trench extensions.

15. The method of claim 14, wherein each of the trenches has a width, and wherein each of the corresponding trench extensions has the width.

* * * * *